(12) United States Patent
Betz et al.

(10) Patent No.: US 7,530,034 B2
(45) Date of Patent: May 5, 2009

(54) APPARATUS AND METHOD FOR CIRCUIT OPERATION DEFINITION

(75) Inventors: Martin Betz, Palo Alto, CA (US); Lokesh Johri, San Jose, CA (US); Rajesh Jain, San Jose, CA (US); Theodore R. Lundquist, Milpitas, CA (US); Tamal Basu, New Delhi (IN); Saurabh Gupta, Noida (IN); Jagadish Narayana Gade, New Delhi (IN)

(73) Assignee: DCG Systems, Inc., Fremont, CA (US)

( * ) Notice: Subject to any disclaimer, the term of this patent is extended or adjusted under 35 U.S.C. 154(b) by 59 days.

(21) Appl. No.: 11/363,787

(22) Filed: Feb. 27, 2006

(65) Prior Publication Data

US 2006/0261043 A1    Nov. 23, 2006

Related U.S. Application Data

(60) Provisional application No. 60/656,333, filed on Feb. 25, 2005.

(51) Int. Cl.
 *G06F 17/50* (2006.01)
(52) U.S. Cl. ............................................. 716/1; 716/2
(58) Field of Classification Search ...................... 716/1, 716/2, 4, 18
 See application file for complete search history.

(56) References Cited

U.S. PATENT DOCUMENTS

| | | | |
|---|---|---|---|
| 6,216,252 B1 | 4/2001 | Dangelo et al. | |
| 6,446,239 B1 | 9/2002 | Markosian et al. | |
| 6,470,482 B1 | 10/2002 | Rostoker et al. | |
| 6,553,546 B1 * | 4/2003 | Murakami | 716/4 |
| 6,629,065 B1 * | 9/2003 | Gadh et al. | 703/1 |
| 6,817,004 B2 * | 11/2004 | Cowan et al. | 716/11 |
| 7,036,109 B1 * | 4/2006 | Tsao et al. | 716/21 |
| 7,257,785 B2 * | 8/2007 | Matsuoka | 716/4 |
| 2002/0035717 A1 * | 3/2002 | Matsuoka | 716/4 |
| 2003/0014725 A1 | 1/2003 | Sato et al. | |
| 2003/0079187 A1 | 4/2003 | Desplats et al. | |
| 2004/0143809 A1 * | 7/2004 | Cowan et al. | 716/11 |

OTHER PUBLICATIONS

PCT International Search Report for PCT/US08/79242 dated Dec. 10, 2008.

* cited by examiner

*Primary Examiner*—Jack Chiang
*Assistant Examiner*—Binh C Tat
(74) *Attorney, Agent, or Firm*—Nixon Peabody LLP; Joseph Bach, Esq.

(57) ABSTRACT

A method and apparatus for defining a circuit operation, such as a charged particle beam operation to perform a circuit edit and define a probe point. Circuit operation definition is performed in a front-end environment with access to integrated circuit computer aided design tools providing logic level and layout level information concerning the integrated circuit. The front-end environment incorporates circuit operation optimization methods to identify optimal locations for a circuit operation. A back-end environment, such as a charged particle tool computing platform, is adapted to receive one or more files, which may include a truncated layout file with circuit operation location information, for use in further defining a circuit operation and/or performing the circuit operation.

20 Claims, 14 Drawing Sheets

Customer Questionnaire

Device Type: [Analog] ← 42

Process Technology (Gate Length): [.18] [um] ← 44

- Device Information

Package Drawing Available    (•) Yes    ( ) No

Sample Device Available      (•) Yes    ( ) No    ← 46

Number Of Pins: [24]

Input/Output [2]   Supply [5]        Cavity: [Up]

Number of Metal layers: [6]

- Metalization:

Aluminum Layers: [2]    Copper Layers: [1]    ← 48

Dummy:   (•) Yes   ( ) No
             At Level: [3]

Packaging:   ( ) Wire Bonded   (•) Flip Chip

- Socket Type:

Manufacture: [1]

DUT clamped [Mechanical]    ← 50

Socket on the System/Application Board:   (•) Yes   ( ) No

Socket readily available:   ( ) Yes   (•) No

...Cad Info  ← 52

[ OK ]    [ Cancel ]

Fig. 3

CAD Info

CAD Nevigation Needed: ⦿ Yes ◯ No  ← 54
CAD Data Available ◯ Yes ◯ No

- Lavel of navigation needed: ← 56
  - ⦿ Layout Display only
  - ◯ Layout with net highlighting
  - ◯ Layout and Netlist linking and highlighting LVS data format: [Dracula]  ← 58

- Media type ← 60
  - ⦿ DDS1-3(DAT tape)
  - ◯ 8 mm tape
  - ◯ 1/4 inch cartridge

- Layout File ← 62
  - Name of data file: [azuma]
  - Name of Top Cell: [CPU]
  - Scale um/DBU: [2]
  - Shrink factor: [1.0]

[ OK ]   [ Cancel ]

Fig. 4

Details of Selected Edit :

Edit Name |NetCut 1|

Select Net [ ]   [Highlight]

Edit Point 1 Location X [0]   Y [0]   [Select Point]

Width for Edit in Microns [10]

Length for Edit in Microns [10]

Depth for Edit in Microns [0]

Time for Edit in Seconds [0]

Beam Current for Edit in mA [0]

Select Gas Type

◆ Gas Cut  ∨ Gas Metal

∨ Gas Dielectric  ∨ Gas Conductor

∨ Gas Insulator  ∨ Gas Copper

Select Scan Type ◆ Scan Normal ∨ Scan Pattern

[Launch OP3]

[OK]   [Cancel]   [Edit Notes]

Fig. 6

Details of Selected Edit :

Edit Name [NetJoin 1]   /86

Select Net 1 [ /82 ]   [ Highlight ]   /88

Edit Point 1 Location X [0]   Y [0]   [ Select Point 1 ]

Select Net 2 [ /82 ]   [ Highlight ] /86   /88

Edit Point 2 Location X [0]   Y [0]   [ Select Point 2 ]

Width for Edit in Microns [10]   — 124A

Length for Edit in Microns [10]   — 124B

Depth for Edit in Microns [0]   — 124C     124

Time for Edit in Seconds [0]   — 124D

Beam Current for Edit in mA [0]   — 124E

Resistance for Join Edit in Ohms [0]   — 124F

Select Gas Type

◆ Gas Cut  ∨ Gas Metal   126

∨ Gas Dielectric  ∨ Gas Conductor

∨ Gas Insulator  ∨ Gas Copper

Select Scan Type ◆ Scan Normal  ∨ Scan Pattern   128

[ Launch OP3 for Net 1 & 2 Join ]  114

[ OK ]   [ Cancel ]   [ Edit Notes ]

Fig. 7

◉ *OP3 Point Suggestions*

116 → Top Ten Points Are: ← 118

∨ X 304.89 Y 79.35  Rating: 98  View

∨ X 325.53 Y 79.35  Rating: 97  View

∨ X 329.65 Y 92.97  Rating: 96  View

∨ X 329.65 Y 118.77 Rating: 95  View

∨ X 329.65 Y 124.55 Rating: 94  View

∨ X 335.43 Y 144.57 Rating: 93  View

∨ X 311.90 Y 154.68 Rating: 92  View

∨ X 237.81 Y 154.68 Rating: 91  View

∨ X 213.05 Y 154.68 Rating: 90  View

∨ X 180.02 Y 154.27 Rating: 89  View

122 ↗                              ↖ 120

OK      Cancel

Fig. 12

APPARATUS AND METHOD FOR CIRCUIT OPERATION DEFINITION

CROSS-REFERENCE TO RELATED APPLICATION

The present application is a non-provisional application claiming priority to provisional application No. 60/656,333 titled "Apparatus and Method for Circuit Operation Definition," filed on Feb. 27, 2005, which is hereby incorporated by reference herein.

FIELD OF THE INVENTION

Aspects of the present invention generally involve the field of post-fabrication processing of integrated circuits for testing, characterization, and/or modification to test design alterations, and more particularly involves an apparatus and method for defining a circuit edit, probe point, or other integrated circuit operation that may be employed by a circuit operation tool, such as a focused ion beam tool, e-beam tool, laser tool, or the like.

BACKGROUND

Fabrication of a newly-designed integrated circuit ("IC") involves preparation of silicon substrate wafers, generation of masks, doping of the silicon substrate, deposition of metal layers, and so on. The IC typically has many physical layers on the substrate with various individual electronic components, such as resistors, capacitors, diodes, and transistors, collectively forming one or more electrical circuits. The metal layers, which may be aluminum, copper, or other conductive material, provide the interconnection mesh between the various individual electronic components to form integrated electrical circuits. Vias formed of electrically conductive material provide communication pathways between various metal layers. Contacts provide communication links between metal layers and individual electronic components embedded in the silicon substrate.

Unfortunately, a new IC of any complexity rarely works as expected when first fabricated. Normally, some defects in the operation of the IC are discovered during testing. Also, some functions of the IC may operate properly under limited conditions, but fail when operated across a full range of temperature and voltage in which the IC is expected to perform. Once the IC has been tested, the designer may change the design, initiate the manufacture of a second prototype IC via the lengthy process described above, and then test the new IC once again. However, no guarantee exists that the design changes will correct the problems previously encountered, or that all of the problems in the previous version of the IC have been discovered. It is also possible that a design will need to be altered for some other reason.

Charged particle beam systems, such as focused ion beam ("FIB") systems and electron beam ("e-beam") systems, laser based systems, and other integrated circuit operation platforms have found many applications in various areas of science and industry. Particularly in the semiconductor industry, charged particle beam systems are used for integrated circuit edits, probe point creation, failure analysis, and numerous other applications. More generally, servicing platforms may be used for testing, analyzing, editing, and/or repairing an IC. For example, charged particle beam systems may be used to edit a circuit ("circuit editing") in order to test design charges and thereby avoid some or all of the expense and time of testing design changes through fabrication. Particularly, a FIB tool typically includes a particle beam production column designed to precisely focus an ion beam on the IC at the place intended for the desired intervention. Such a column typically comprises a source of ions, such as Ga+ (Gallium), produced from liquid metal. The Ga+ is used to form the ion beam, which is focused on the IC by a focusing device comprising a certain number of electrodes operating at determined potentials so as to form an electrostatic lens system. Other types of charged particle beam systems deploy other arrangements to produce charged particle beams capable of various types of circuit edits and operations generally. Further, laser-based systems deploy various types of lasers for purposes of laser based circuit editing.

As mentioned above, IC manufacturers sometimes employ a FIB system to edit the prototype IC, thereby altering the connections and other electronic structures of the IC. Circuit editing involves employing an ion beam to remove and deposit material in an IC with precision. Removal of material, or milling, may be achieved through a process sometimes referred to as sputtering. Addition or deposition of material, such as a conductor, may be achieved through a process sometimes referred to as ion-induced deposition. Through removal and deposit of material, electrical connections may be severed or added, which allows designers to implement and test design modifications without repeating the wafer fabrication process.

When a charged particle beam or laser operation is planned, the problem arises of selecting the area of the circuit where each step is to be carried out. Typically, there are many theoretical possibilities for executing each step, all equivalent with respect to the electrical circuit. For example, an equipotential branch can be cut at any point, an electrical measurement can be made at any point of a branch, and a deposition can be carried out to form a connection between two branches between any two points on these branches. However, while theoretically equivalent or the same, the many alternative locations for any circuit operation are not the same or equivalent in terms of practicality. First, the servicing area must be accessible to the servicing tool from the access surface. For example, cutting a metal connection hidden under a transistor configuration would require the damage or destruction of the transistor to reach the metal connection. Second, the difficulty of execution is not always the same. For example, it is more difficult to perform a circuit operation in an area with densely arranged circuit elements than in an area of less densely arranged elements. Third, the duration of the work can vary considerably. The duration depends on various factors including the depth of the layer on which the work is done (in other words, the distance from the access surface) and the difficulty of accessing the servicing area in question with the tool. In the case of deposition, the duration also depends on the length of the track that is deposited.

For any modern IC, descriptive data is provided to identify, in each layer of a circuit, a number of polygons, each formed from a characteristic material (metal, polysilicon, etc.), by which the IC is fabricated. The IC descriptive data is often referred to as "layout" data. Further data representing the logical or electrical layout of the circuit is also typically provided, which may be displayed in schematic form.

Conventionally, determining the proper location for a circuit operation is an iterative manual process. First, a designer may request a change in the schematic for some reason. There are numerous possible reasons for a requesting a design change, such as identification of a design error, identification of a process-design interaction that may impact yield, identification of an IC functionality error during testing, customer changes to an IC specification, etc. The designer request is often made at the schematic or logic level. So, for example, the designer requests that an output signal from a logic block be connected to another logic block, when the connection is not currently present. There is currently no standard form for the designer to make a request for a circuit edit. As such, the request may be made by way of email, sketches, memorandum, marked-up RTL or netlist print-outs, and the list goes on.

From the schematic request, someone must check the physical layout and attempt to ascertain where in the layout a change should be made to meet the schematic request. Then, the circuit editor, e.g., the person that runs the FIB tool, double checks the requested layout change. After determining a location in the layout to make a change, the decision is returned to the front-end design person for approval.

SUMMARY

One aspect of the invention involves a method for defining circuit operations using a circuit operation tool. The method involves providing access to computer aided design data for a integrated circuit and providing navigation about said computer aided design data to identify a location for conducting a circuit operation on the integrated circuit. Additionally, the method involves providing for generation of at least one file containing information concerning the location for conducting the circuit operation on the integrated circuit. The method may be embodied in various forms, including computer executable instructions.

Another aspect of the invention involves a method for performing a circuit operation comprising providing access to computer aided design data for a integrated circuit and providing navigation about said computer aided design data to identify a location for conducting a circuit operation on the integrated circuit. The method further involves providing for generation of at least one file containing truncated computer aided design data concerning the location for conducting the circuit operation on the integrated circuit. In one implementation, the truncated computer aided design data includes one or more truncated GDS-II files.

BRIEF DESCRIPTION OF THE DRAWINGS

FIG. 3 is a screen shot of one possible input medium for providing information concerning an integrated circuit targeted for a circuit operation, in accordance with aspects of the present invention;

FIG. 4 is a screen shot of one possible medium for providing computer aided design information that may be used in aspects of defining a circuit operation, in accordance with aspects of the present invention;

FIG. 6 is a screen shot of one possible medium for defining various aspects of net cutting or probe point creation circuit operations, in accordance with aspects of the present invention;

FIG. 7 is a screen shot of one possible medium for defining various aspects of a net joining circuit operation, in accordance with aspects of the present invention;

FIG. 12 is a screen shot of one possible outcome format generated by accessing one or more methods for optimizing a circuit operation location determination, in accordance with aspects of the present invention;

DETAILED DESCRIPTION OF EMBODIMENTS OF THE INVENTION

Aspects of the present invention involve an apparatus and a method for defining some type of circuit operation, such as a circuit edit, a probe point, or some other type of servicing operation using a charged particle beam tool (e.g., FIB tool, e-beam tool, etc.), laser circuit edit tool, or other type of circuit operation tool. In one sense, aspects of the invention involve the concept of abstracting the circuit operation definition to a front-end circuit operation definition environment and providing a communication medium to a back-end circuit operation platform that allow a front-end designer and a circuit editor to collectively and efficiently optimize circuit operation definitions. In another sense, aspects of the invention involve the ability of the front-end circuit operation definition to link with and manipulate front-end circuit design platforms, such as logic and layout data for an integrated circuit targeted for a circuit operation, in order to efficiently and accurately identify a specific location, such as a net, metal line, layer, etc., in the target IC for a circuit operation.

Figure 1:
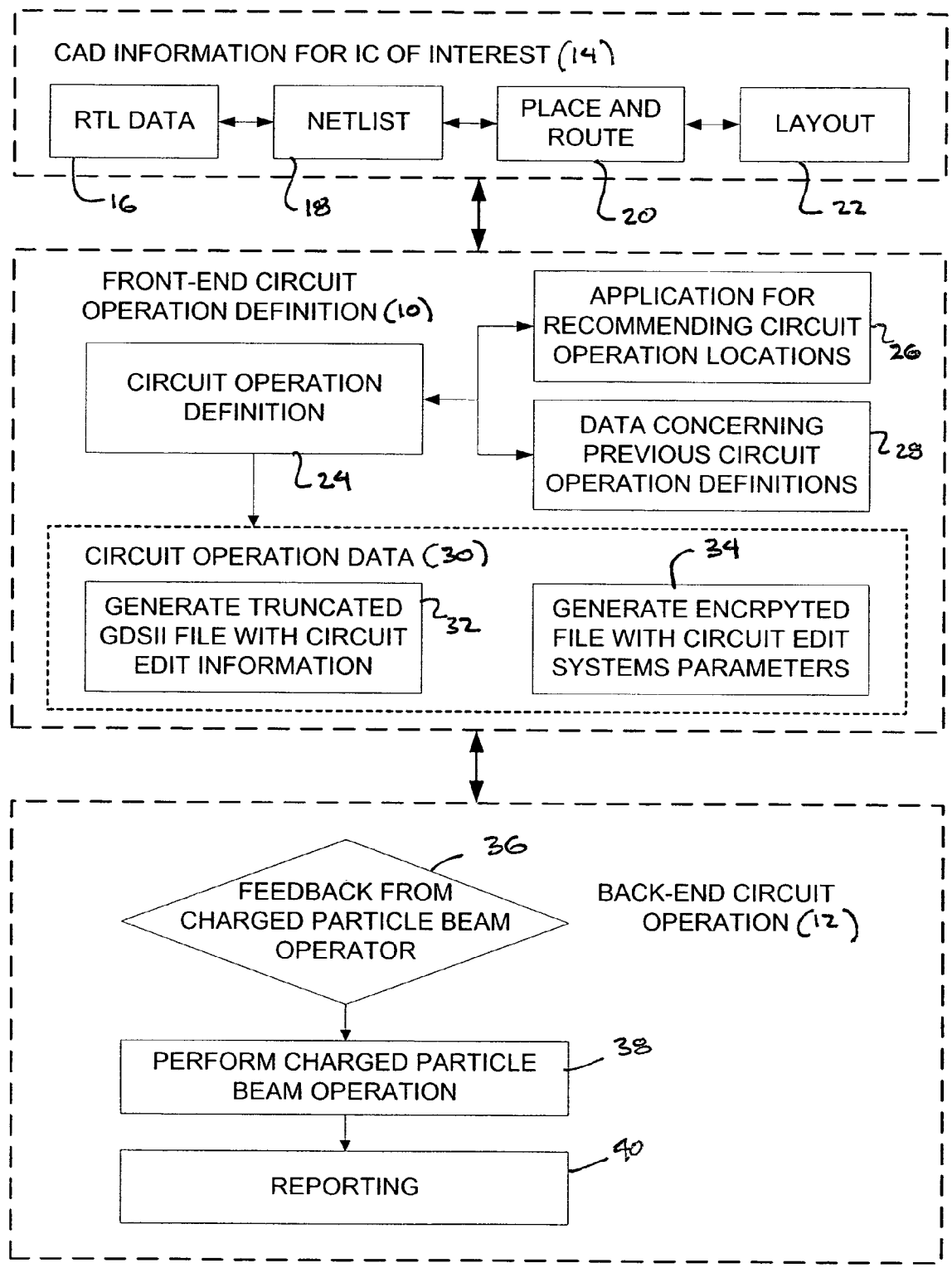
FIG. 1 is a system layout, communication, and high-level flow diagram illustrating various aspects of the present invention.

FIG. 1 is a system layout, communication, and high-level flow diagram illustrating a front-end circuit operation definition environment 10 in communication with a back-end circuit operation environment 12 and also in communication with computer aided design ("CAD") platforms 14, according to various aspects of the present invention. The system may be conceptually subdivided into two functional areas, the front-end circuit operation definition area and the back-end circuit operation area. The front-end circuit operation definition area is used to define or specify one or more circuit operations on an IC. The back-end circuit operation area is used to perform the specified circuit operation.

The various specific operations and functional areas may be deployed in a single computing platform, or more likely a plurality of computing platforms configured to communicate over private and/or public networks. As used herein, the term "circuit operation" is meant to refer to various possible operations, including circuit edits and probe point creation, performed on a fabricated IC. The term "circuit edits" broadly refers to any type of charged particle beam, laser beam, or other beam-based procedure that modifies an IC in any way, including cutting or removing any feature of an integrated circuit as well as depositing material, such as a depositing a conductor or trace to form an electrical connection or pathway. The term "probe point creation" broadly refers to any type of charged particle beam, laser beam, or other beam based procedure that creates an access point or connection to some feature, such as a metal line, via, or a contact, of an IC that facilitates obtaining information, such as waveforms, voltage levels, digital logic levels that may be compared to an expected result, etc., from the probed feature.

The front-end circuit operation definition area 10 is in communication with and is able to manipulate CAD data 14 for an IC and related CAD applications. The accessible CAD information may include RTL data and applications 16, netlist data and applications 18, place and route data and applications 20 and layout data and applications 22, which are all discussed in greater detail below. As a general notion, the CAD information for a particular IC is the information that relates to the design and fabrication of an IC. With the front end circuit operation area, a user may communicate with and manipulate the CAD information at different levels in order to specify a circuit operation. Moreover, different types of CAD information and applications are configured to communicate in a manner that facilitates the definition of a circuit operation and the tracking of information between different types of CAD information. For example, a user may access logic level information to assess which logic structure might be malfunctioning and determine a possible course of action for a circuit operation. The logic information, however, does not tell the user how the actual integrated circuit is fabricated in silicon. Thus, the user may also then access layout information, for example, to determine where actual structures reside and the metal interconnections therebetween.

In defining a circuit operation 24, the user may also conduct some or all circuit operation definition manually (without access to CAD information). Further, circuit operation definition may include access to applications 26 configured to assess CAD information and provide information as to recommended options for a particular circuit operation, which is also discussed in greater detail below. Finally, circuit operation definition may provide information 28 to previous circuit operations, which may be used in defining a circuit operation. Irrespective of the various possible options and information employed in defining a circuit operation, the front-end area provides circuit operation data 30 to the so-called back-end circuit operation area 12. As shown in FIG. 1, the data may include truncated GDS II data 32 and an encrypted file 34, which is discussed in greater detail below. The form of the circuit operation data however may take other forms, as the example set forth herein is merely one possible implementation.

The back-end area 12 may be implemented in a computing platform associated with or in communication with a charged particle tool or other circuit operation tool. Examples of charged particle tools that may be modified to implement the back-end circuit editing area or in communication with an appropriately configured platform include the Credence Systems Corporation's IDS OptiFIB focused ion beam tool, which includes an ion column coaxially aligned with an optical microscope. The OptiFIB system can direct a focused ion beam on a target IC for circuit edits and probe point creation, and can also obtain optical images of the IC as well as secondary electron based images. The back-end area receives circuit operation information from the front-end area for purposes of conducting the operation, and also allows a user to modify, further define, and/or comment 36 on any proposed circuit operation 18. Further, the back-end area allows the user to generate circuit operation reporting information 40 and transfer such information to the front-end environment, before, during, and/or after a circuit operation.

Figure 2:
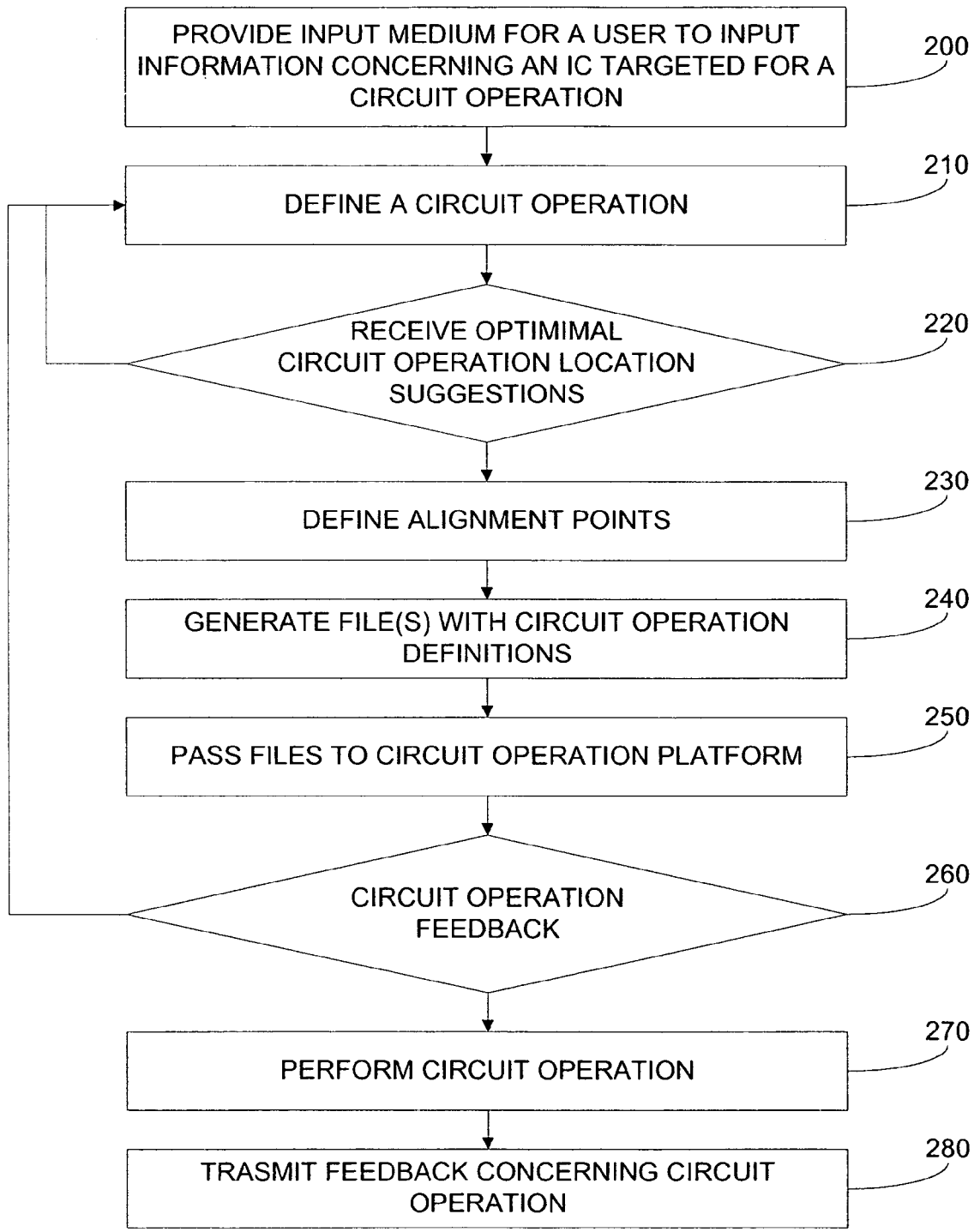
FIG. 2 is a flowchart illustrating various operations for defining a circuit operation, in accordance with aspects of the present invention.

The following description involves one example of an implementation of an apparatus and method for circuit operation definition. Any particular implementation may involve only a subset of the overall implementation set forth herein. Moreover, any possible implementation may take advantage of the inventive concepts set forth herein, but may take on a different form of implementation than specifically set forth herein. The description involves reference to the system level block diagram of FIG. 1 and the flowchart of FIG. 2 illustrating one possible arrangement of operations. With respect to various operations, reference and discussion refers to various possible examples of computer accessible interfaces and applications for accessing and providing input in the process of defining and executing an operation. These are merely examples of one possible implementation.

Referring now to FIG. 1-4, in one particular example, the front-end circuit operation definition area 10 provides an input medium, such as window-type screen or screens, for a user to input, select, or otherwise provide information concerning an IC targeted for a circuit operation, sometimes referred to as a "target IC" (operation 200, FIG. 2). Referring particularly to FIG. 3, one example of a first screen for providing information concerning a target IC is shown. Drop down selection menus, radio buttons, and manual input windows are provided as input mediums for the user to provide information about the target IC. For example, a dropdown menu 42 is provided for the user to provide information concerning whether the target IC is analog or digital, and input windows 44 are provided for the user to enter the gate length of the process technology (e.g., 90 nanometer, 0.18 micrometer, etc.) used to fabricate the target IC. Further, a series of input mediums 46 are provided where the user may input information concerning whether a package drawing is available, whether a sample of the IC is available, the number of pins of the IC, the number of I/O, the supply voltage, and the cavity type. Additionally, various input mediums 48 are provided where the user may input information concerning the metallization layers of the IC, such as the number of aluminum and copper metal layers, the total number of layers, whether a dummy layer is provided and at what level. The screen also provides mediums 50 for the user to provide input packaging information, such as whether the IC is a wire bonded or flip-chip device, and socket information, such as the manufacturer, the type of DUT clamp, whether a socket is provided on the system/application board, and whether a socket is readily available. Finally, a button 52 is provided that launches the second screen (FIG. 4) where the user may request to input information concerning computer-aided-design ("CAD") for the IC.

Referring now to FIG. 4, one example of a second screen is shown for providing information concerning the application of CAD data in the circuit operation definition process. The second screen provides two buttons 54 for a user to indicate whether CAD navigation is needed for the circuit operation definition, and whether CAD data is available. As discussed herein, the front-end area 10 provides a communication and control medium for a user to interface with various CAD tools 14 to facilitate the definition of a circuit operation. Further, the second screen provides inputs 56 that allow a user to indicate the level of CAD navigation desired. The CAD navigation levels may include layout design only, layout with net-highlighting, and layout with netlist linking and highlighting, in one example. The second screen further includes input mediums for the user to identify the LVS data format 50, the media type of the CAD data 60, and layout file information 62. It is possible, however, to perform or otherwise define a circuit operation without CAD data.

In one example, the user inputs some or all of the information requested in the first two screens. The information may be used later to assist circuit operation definition. Further, the information is passed to the back-end 12 in a circuit operation definition file 30, which may be an encrypted XML file 34. Some or all of the information may be pre-established, such as through access to a database of circuit information. Moreover, some information may not be required for performance of a circuit operation or may not be available, such as when proprietary issues are involved. Thus, it is not necessary for the user to input all of the information in order to define a circuit operation.

Referring to FIGS. 1 and 2, after the user inputs various information concerning the target IC, a user defines, in whole or in part, a circuit operation (24, FIG. 1; operation 210, FIG. 2). Definition of the circuit operation occurs, in whole or in part, in the front-end area 10. The circuit operation definition can be supplemented by way of access to and passing information to an application that processes integrated circuit data in order to generate one or more optional locations for a circuit operation (26, FIG. 1). Further, the circuit operation definition may access previous circuit operation definition for guidance and/or modification thereof (228, FIG. 1). The circuit operation definition may also be processed to the back-end 12 and then modified at the front-end based on information 36 from the back-end.

Figure 5:
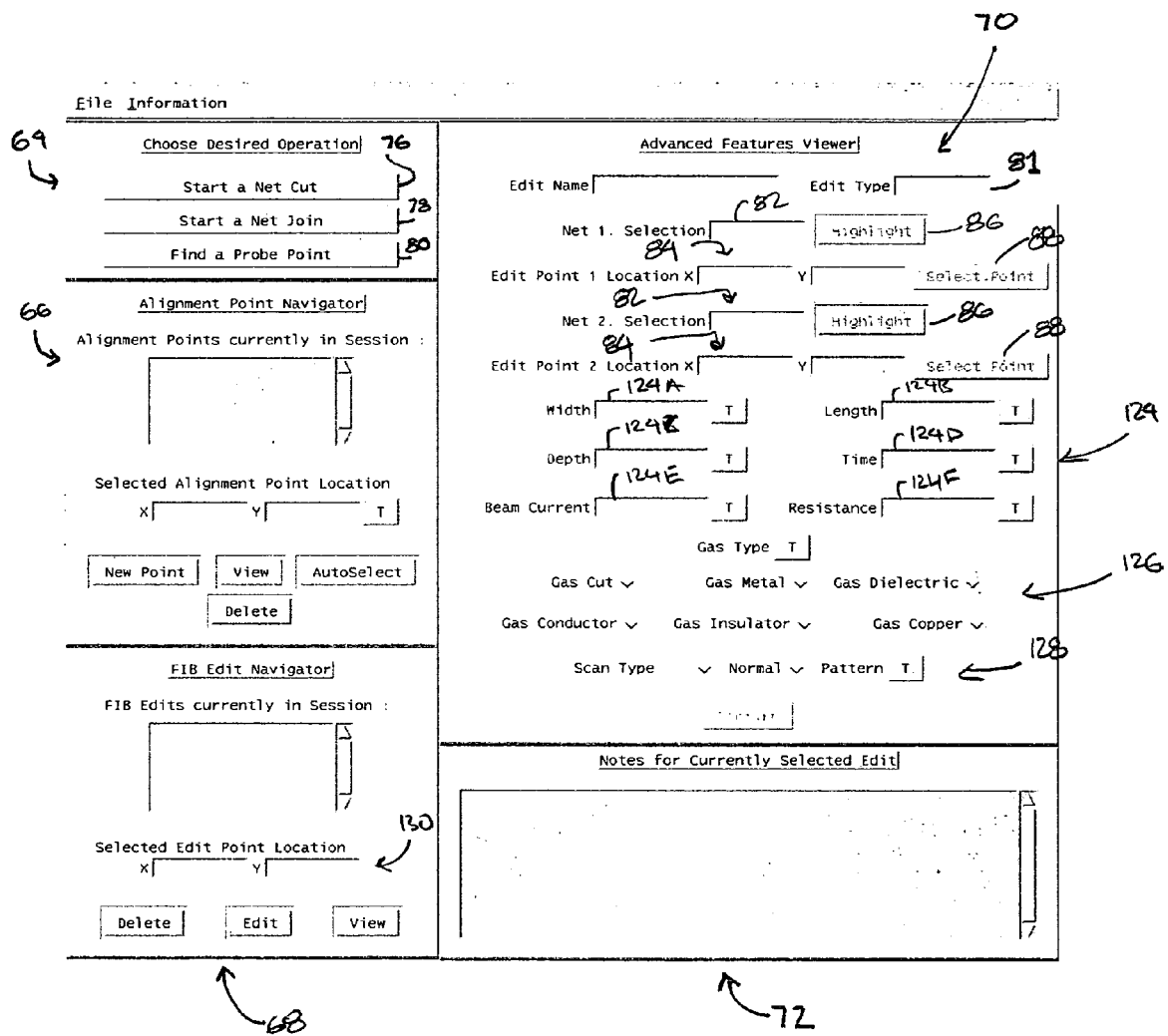
FIG. 5 is a screen shot of one possible medium for defining various aspects of an integrated circuit operation, in accordance with aspects of the present invention.

Referring now to FIG. 5, one example of a circuit operation definition screen for entering circuit operation definition information, is shown. The screen is subdivided into five general areas involved in providing information for defining a circuit operation. The five areas include a circuit operation type identifier area 64, an alignment point navigation area 66, a FIB edit navigator area 68, an advanced features viewer area 70, and an input window 72 for a user to provide comments concerning a proposed circuit operation. The user may provide some or all of the information requested in the various areas, and in any order.

First, with reference to the circuit operation type areas, a user may specify the type of circuit operation. In this particular implementation, a user may choose from three particular types of circuit operation. The types include, but are not limited to, starting a net cut 76, starting a net join 78, and finding a probe point 80. Selection of the appropriate buttons begins the process for defining a net cut, net join, or probe point operation definition. As used herein, the term "net" refers to an interconnection of metal lines at the same potential and carrying the same signal. The metal lines may be in one layer or may be located in different metal layers, and connected by way of vias or other connective structures. A user may also begin a circuit operation definition by selecting or entering an appropriate edit type in the "edit type" field 81 of the advanced features viewer 70. In one implementation, the advanced features viewer may not allow new data input, but only allow modification of previously input data. Further, a user may launch a discrete window, similar or the same to the desired operation area, by selecting a designated "hot key" while in a linked layout viewer (discussed below).

Selecting the "Start a Net Cut" button 76 launches a screen for defining a net cut operation. One example of such as a screen is shown in FIG. 6. Selecting the "Find a Probe Point" button 78 launches a screen for defining a probe point operation. In one example, the probe point definition screen looks the same as the net cut screen, except the "Edit Name" field is initially identified with a "NetCut" indicator for a net cut definition or a "Probe Point" indicator for a probe point definition. Selecting the "Start a Net Join" button 80 launches a screen for defining a net join operation. One example of such a screen is shown in FIG. 7. If the advanced feature viewer is used, then circuit operation may be defined similarly or the same as discussed with reference to FIGS. 6-7, but the associated fields in the advanced features viewer section are defined.

Referring to FIGS. 5-6, in defining a probe point or net cut circuit operation, a user first selects a location in the target IC for performing a circuit operation. Location information includes an indication of a net and a specific spatial coordinate of the net. To define a net cut or probe point, a user may define a circuit operation location by identifying a net to cut or probe (input 82) and entering X and Y coordinate information (inputs 84) for some portion of net that will be cut or probed. Nets are associated with various layer or depth information so a circuit operation location definition is directly or indirectly associated with depth coordinates. To define a net joining operation, the user may define circuit operation locations by way of entering two nets that will be joined, and specifying X and Y coordinates of some portion of each net that will be joined. Net and coordinate information may be entered manually through various implementations or the user may access CAD data to provide the net and coordinate data. To access CAD data for the target IC and select a net where an operation will occur, a user may select a "Highlight" button 86, which allows the user to communicate and manipulate target IC CAD data associated with the target IC, to specify a net of interest, or the user may select a "Select Point" button 88, which allows the user to access and manipulate target IC CAD data to identify coordinates of interest.

Referring to FIG. 1, within the front-end circuit operation definition area 10, a user may identify circuit operation locations by communicating with and manipulating various CAD tools 14 that may access and display CAD data related to the target IC. In one example, the front-end platform provides a communication and control interface, such as with socket technology or tool command language ("TCL") for inter-process communication ("IPC"), into RTL 16, netlist 18, place-and-route 20, and layout tools, such as Novas Verdi™ applications and various layout tools. In the front-end circuit operation definition environment, a user may first conceive of circuit operation location with reference to the logic level of the integrated circuit. The logic level, as used herein, generally refers to register transfer language ("RTL") data and netlist data corresponding to an IC of interest. The RTL data can include a schematic representation illustrating various circuit elements, logical structures, and the like of the IC along with connections therebetween. Netlist data can include a schematic diagram of various nets of an IC. Where the RTL data typically illustrates the logical connections between gates, logic elements, etc., a netlist typically has polygon information illustrating the actual physical layout of a net or nets. Nets may interconnect cells at any level of hierarchy.

At the logic level, a designer or other person may first consider circuit operations in the context of a logic level schematic. As mentioned above, in one implementation, the system supports three types of circuit operations: (1) net cutting, (2) net joining, and (3) probe point creation. Net cutting involves removing some connectivity to a given net. Net joining involves joining two or more nets. Finally, probe point creation involves defining a probe point for obtaining information from a net. At the logic level, the user may determine what connection to open, close, or probe, which can be translated to determining what net to cut or probe, or what nets to join.

Figure 8:
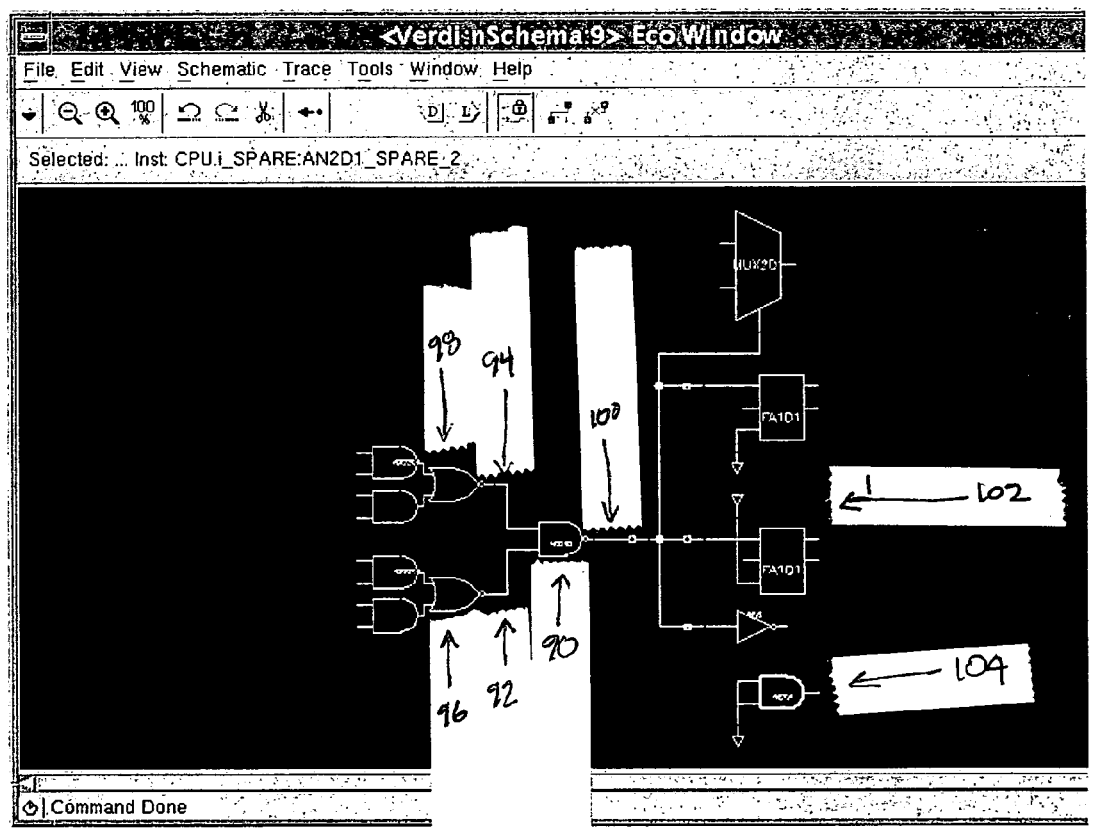
FIG. 8 is a screen shot of a logic diagram corresponding with logic data before design change for a portion of an integrated circuit.
Figure 9:
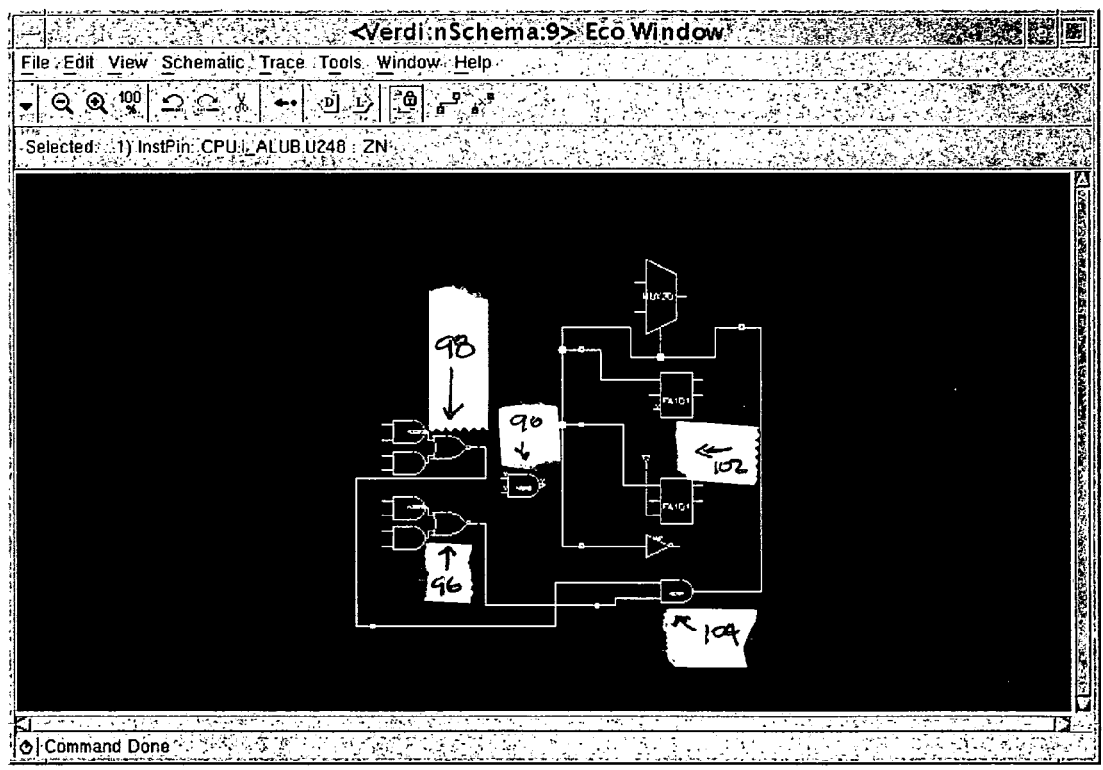
FIG. 9 is a screen shot of a modified logic diagram corresponding with logic data after design change for a portion of the integrated circuit shown in FIG. 8, in accordance with aspects of the present invention.
Figure 10:
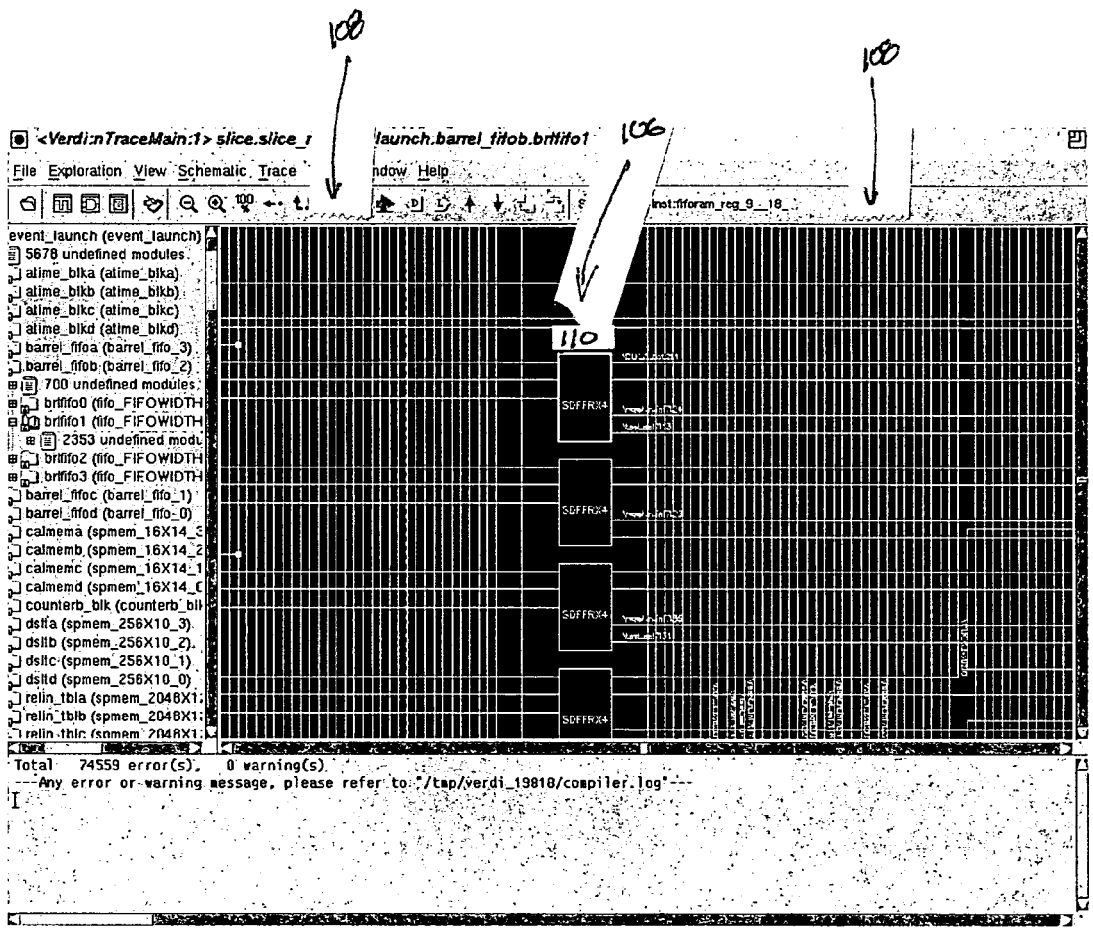
FIG. 10 is a screen shot of a logic diagram corresponding with logic data for a portion of an integrated circuit.

FIG. 8 is an example of an RTL based logic diagram of a discrete section of an integrated circuit. The logic diagram includes an AND gate 90 with inputs (92, 94) from two OR gates (96, 98), and an output 100 to other functional components 102. The connection 94 between the top OR gate 98 and the first input to the AND gate 90 corresponds to a first net (Net 1). The connection between the lower OR gate 96 and the second input 92 to the AND gate 90 corresponds to a second net (Net 2). Finally, the connection 100 from the AND gate to the other functional components 102 corresponds to a third net (Net 3). A user may determine that the AND gate is not functioning properly. As such, it may be desirable to functionally replace the AND gate with another AND gate. In this example, a spare AND 104 gate is present in the circuit in the lower right corner. Some integrated circuit designs include spare functional components. FIG. 9 illustrates a logical rewiring that replaces the malfunctioning AND gate 90 with the spare AND gate 104. As such, the OR gates (96, 98) are each connected to the appropriate input of the spare AND gate, and the output of the spare AND gate is connected to the other functional components.

In practice, any such AND gate replacement must be performed within the confines of a fabricated IC. In general, to disconnect the malfunctioning AND gate, the nets (92, 94) associated with the AND gate inputs and the net 100 associated with the AND gate output will be cut in an appropriate location. Thus, nets 1, 2, and 3 are cut. These cuts will require precise navigation about the IC and precise employment of a focused ion beam to mill a hole in the IC to the appropriate vertical and horizontal location to sever some portion of the appropriate nets. Further, to connect the spare AND gate 104, various nets will be electrically connected. The FIB will be employed to cut trenches and deposit conductor between the nets associated with each OR gate output and the nets of the respective inputs of the spare AND gate, and to deposit conductor between the net of the spare AND gate output and the net associated with the other functional components.

Figure 11:
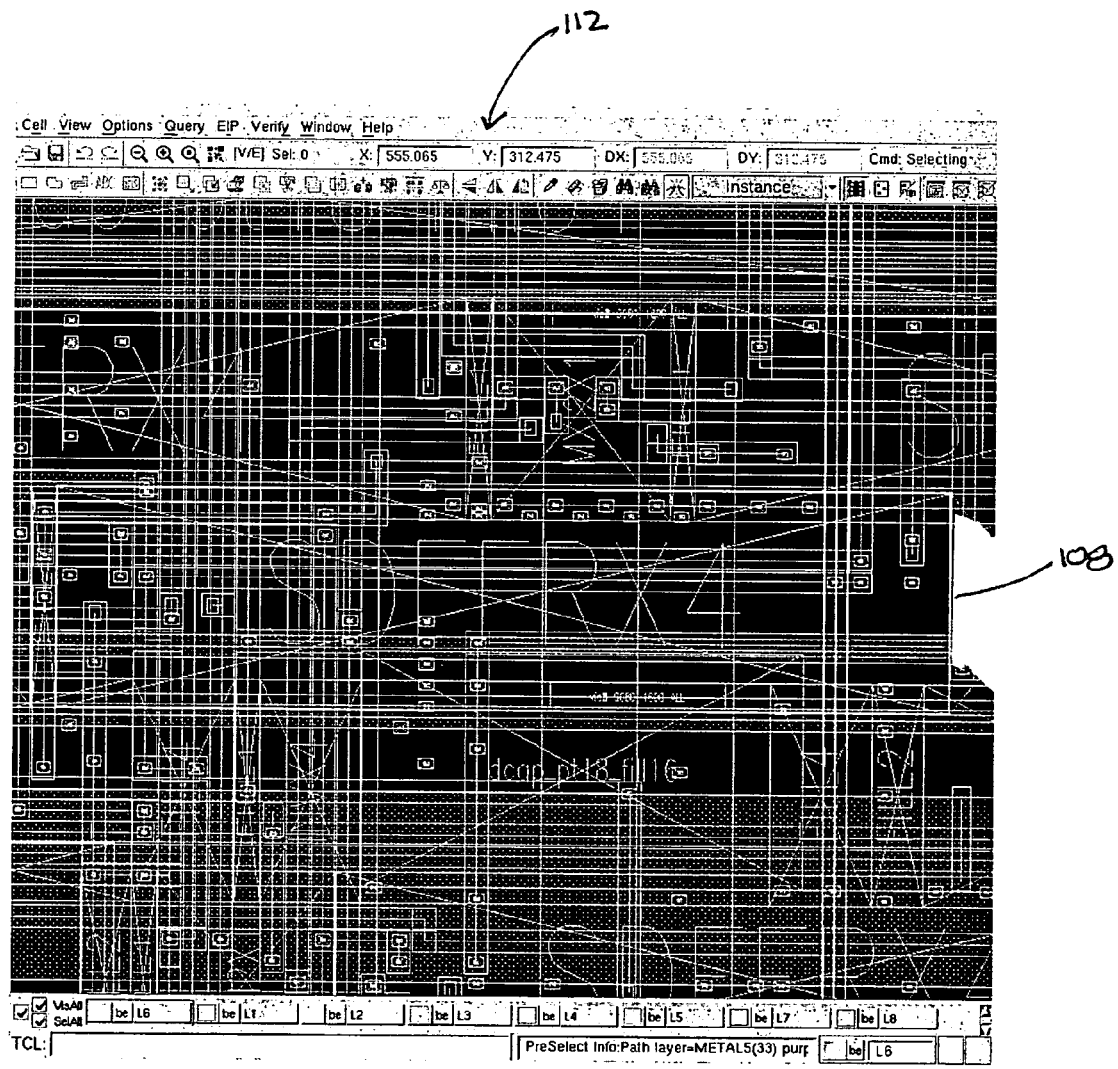
FIG. 11 is a screen shot of layout diagram corresponding with layout data for the portion of the integrated circuit of FIG. 10, where layout elements of FIG. 11 are linked (e.g., highlighted) to correspond with selected logic elements in FIG. 10, in accordance with aspects of the present invention.

To facilitate circuit operations necessary to obtain the logical changes, aspects of the present invention provide a communication means for defining and facilitating layout level changes based upon conceptual changes defined at the logic level. First, aspects of the present invention employ a drag-and-click functionality that allows a user to communicate between RTL, netlist, and layout platforms. Referring to a different example than that set forth in FIGS. 8 and 9, FIGS. 10 and 11 provide an example of a logical view of four functional units 106 and an interconnection mesh 108 (FIG. 10) and the layout view of the top functional unit 110 (FIG. 11) with various nets. FIG. 11 shows the top functional unit highlighted by selecting the logical view of the top functional unit (shown highlighted in FIG. 10) and dragging it to the layout view. The same click-and-drag operation, employed in Verdi™ or other applications, may be done with nets. Similarly, with reference to FIGS. 8 and 9, by selecting the replacement AND gates and its input and output net gates, the user may also highlight these physical structures by dragging them from the logical view to a layout view. The layout is highlighted with the actual metal lines forming the nets and the doped silicon structures forming the AND gates which provides the user with information for defining the location or locations for circuit operations.

From the layout data the user has two options for defining a specific location for a probe point, cut, or net connection. In the first option, a user may navigate through the layout data to identify a particular X and Y location to make a cut, create a probe point, or to connect a net. By placing a pointer on the target net location, the X and Y coordinate data 112 is provided. As mentioned above, a user may select particular logic elements and connections and drag those connections into layout data in order to highlight the physical structures in the semiconductor that relate to the highlighted logic elements and connections. With this information highlighted in the layout data, a user may navigate through the layout data and identify a particular point along a net at which to define a circuit operation. The user defined information is entered into the X and Y locations 84 for the edit point (FIGS. 6-7) or edit point locations (FIG. 7) either automatically or manually along with indication of the net 82 (FIG. 6) or nets (FIG. 7) associated with the coordinates.

Alternatively, referring to FIG. 1 and FIG. 2, a user may activate an algorithmic process for defining optimal locations for performing circuit operations (26, FIG. 1; operation 220, FIG. 2). Referring now to FIG. 6, optimal probe point, net cut, or net joining generation is launched by way of the "Launch OP3" button 114. Before launching the optimal probe point application or applications, it is appropriate to select a net (82, FIGS. 6-7) that you seek to probe or cut, or nets that you seek to connect. For optimal probe point generation, the system implements or may access a method and apparatus for determining optimal probe point placement. In one example, the apparatus and method for determining optimal probe point placement is described in U.S. Pat. No. 5,675,499 titled "Optimal Probe Point Placement," issued on Oct. 7, 1997, which is hereby incorporated by reference herein. For optimal net cutting and net connection location generation, the system incorporates or may access an apparatus and method for determining optimal cutting and joining operations. In one implementation, the system employs or may access an apparatus and method for optimal location of a net cut or a net joining as disclosed in U.S. patent application Ser. No. 10/257,034 (U.S. Pub. No. 2003/0079187) titled "Method and Device for Automatic Optimal Location of an Operation on an Integrated Circuit," filed on Apr. 6, 2001, and published on Apr. 24, 2003, the disclosure of which is hereby incorporated by reference herein.

For optimal probe point placement, the system consults the layout description and netlist description along with cross-reference descriptions of the target IC. The system compares layout information concerning each net with various probe point placement rules in order to define a set of possible probe point locations. In one implementation, the application generates more than one possible probe point location and also provides a rating or score associated with each possible probe point. The '499 patent referenced above provides additional details concerning the rules associated with determining and rating possible probe points. The optimal probe point placement patent also includes information concerning ways to identify optimal net cutting locations and net joining locations. The '034 application describes a method for determining optimal locations for an operation on an integrated circuit. As with the OP '499 patent, the '034 application describes an apparatus and method that analyzes layout and net listing information in order to generate a list of optimal locations to perform a net cut or net joining operation. Again, a list of possible net cut or net joining locations are generated along with a rating for each possible operation.

FIG. 12 is a screen illustrating ten possible probe point locations 116 and a corresponding rating 118 generated by the optical probe point application. Various numbers of possible probe points may be generated. In one example, navigating in the layout view for a target IC, the user selects a net (82, FIG. 6) where a probe point is desired. The user then selects the "Launch OP3" 114 button which activates an application implementing methods discussed in the '499 patent. The method accesses CAD information for the target IC and generates the list of possible X and Y coordinate locations 118 to provide a probe point, shown in FIG. 12. The user may view the specific location in the layout associated with each recommended probe point location by selecting the "View" button 120. This button will launch the layout view, and highlight on the layout view the exact location for the recommended probe point. To select any of the recommended probe points, the user may either select the button 122 to the left of the XY coordinate data shown in FIG. 12, or the user may enter the XY coordinate information in the respective XY coordinate input windows of FIGS. 5, 6, or 7. For a net joining operation, a similar screen to FIG. 12 is provided after running an application implementing methods described in the '034 application, except that sets of optimal connection points between two nets are illustrated and selectable by the user.

Referring again to FIGS. 5, 6, and 7, after selecting the particular edit point location or locations, a user may enter further information defining the circuit operation. For example, input windows 124 are provided for the user to enter a width for an edit (124A), a length of an edit 124B, a depth of an edit (124C), and a time for an edit (124D), and a beam current for an edit (124E). In one example, the width, length and depth definitions are provided in micrometer measurements, the time for edit definition is provided in seconds, and a beam current definition is provided in milliamps. For a net join operation, it is also possible to specify a resistance for the connection (124F). It is possible, however, to provide such definitions in other appropriate units as the case may be. The user may also define an assisting chemistry type and type of cut 126 for the particular operation being conducted, such as a unassisted cut, a chemistry assisted metal cut, a chemistry assisted dielectric cut, a chemistry assisted conductor deposition, a chemistry insulator deposition, and a chemistry assisted copper cut, etc. Finally, a user may define the scan type 128 for the charge particle tool. In one example, a normal scan may be selected which rasters the charge particle beam in a rectangular pattern. Alternatively, a user may select and define a customized scan pattern in a manner described in co-pending application Ser. No. 10/931,321 titled "Enhanced Scanning Control of Charged Particle Beam Systems" filed on Aug. 31, 2004, which is hereby incorporated by reference herein. Finally, the user may attach editing notes to the circuit operation definition by selecting the Edit Notes button and entering appropriate information in a window 72 provided.

After defining many parameters for a circuit operation, a user may also define alignment points (operation 230, FIG. 2). Referring again to FIG. 5, the alignment point navigator section 66 allows a user to identify various points in a layout diagram to align with a focused ion beam image or optical image of the actual target IC during a circuit operation. For accurate alignment, it is preferable to select at least three points in the layout to align with the focused ion beam image or optical image. When using a focused ion beam tool, it is possible to generate an image of the target IC by way of collecting secondary electrons emitted from the IC while being bombarded with the focused ion beam. It is also possible, in a focused ion beam tool, such as the OptiFIB tool, to also generate an optical image of the target IC before, during or after a focused ion beam operation. The user may enter alignment point X and Y coordinates manually, or may enter alignment points by way of selecting a location on the layout data. To select an alignment location by way of the layout data for the target IC, a user selects the new point button, which launches the layout window. The user then clicks on a particular X and Y coordinate within the layout window, which populates the X and Y windows 130 of the alignment point navigator. If the user moves the mouse about the layout window, the alignment location X and Y coordinates will adjust appropriately. The selection of the X and Y net cut or join, and probe point operations may be accomplished similarly. The user may enter subsequent alignment points by selecting the new point button and following the same procedure discussed above.

Alignment points are used to ensure that a CAD image, used for operation location navigation, is properly aligned with the FIB image before and during a circuit operation. A FIB tool includes a platform for mounting an IC. When the IC is placed on the platform, it may be rotated at some angle, 90, 180 or 270 degrees, when compared to the associated CAD image of the IC. Alignment points ensure that the CAD image aligns with the actual IC on the platform. In one implementation, an alignment point is the center point in a 10 micron by 10 micron area on the silicon. As mentioned elsewhere, at least three alignment points are preferable to ensure that error is the within tolerance levels as well as determine X and Y magnification adjustments between the CAD and the actual device. The more alignment points chosen the better is the accuracy in alignment between the images. The alignment points are typically near, but not at, the corners of the IC layout. Points that are unique are usually preferred so that other points cannot be confused. As such, alignment points in an area near a corner with active features such as depositions, n-wells and p-wells are preferred. In one implementation, four alignment points may be automatically generated.

When the user has settled on a particular alignment point, he may select enter or select the "T" button next to the X and Y coordinates in the alignment point navigator, which causes a popup window to display where a user may enter text or other data concerning the selected alignment points.

Referring to FIG. 1 and FIG. 2, upon completion of all or part of a circuit operation definition, which may include circuit operation location information, alignment data, and beam characteristics, the system may generate one or more files, such as a truncated layout file 32 and an encrypted file 34 with beam characteristics and other aspects of the circuit operation definition (operation 240, FIG. 2). Layout data for an integrated circuit is often provided in LefDef, Oasis, and GDS-II file format. These are standard file formats for transferring and archiving graphical design data. It contains a hierarchy of structures containing elements situated in layers. It is typically a binary format that is platform independent. Pattern data is contained in a library of cells. Each cell may contain geometric objects such as polygons, paths, and other cells. Objects or structures in a particular cell are assigned to layers of the design. As outlined above, different layers typically represent different processing steps for exposure on separate mask plates. For a typical integrated circuit, layout files may exceed two gigabytes of information. As such, transferring complete layout files over network connections or on removable memory media is unwieldy, time consuming, and generally not efficient or not practical.

Referring again to FIG. 1, in one implementation of the present invention, after a circuit operation is defined, the system process layout data (e.g. LefDef, Oasis, and GDS-II data) and generates a truncated GDS-II file 32 with circuit operation information and other layout information. It is also possible to generate truncated LefDef, Oasis, or other layout file types. The truncated GDS-II file includes layout information at the identified X and Y coordinates and layout information in the immediate surrounding area, but eliminates other layout information. As such, the truncated GDS-II file is dramatically smaller in size than a complete GDS-II file for the entire IC. The truncated GDS-II file is thus more wieldy and smaller in size making transmission of it over a network quicker and requiring less memory. The truncated GDS-II file also includes relative positioning between the circuit operation location and the various alignment points. The truncated GDS-II file also contains the alignment points and information related to the layout in the vicinity of the alignment points. GDS-II files are typically highly proprietary and many companies do not allow or heavily restrict usage within their own company let alone vendor access to GDS-II files. A truncated GDS-II file provided in implementations of the present invention ameliorates this potential issue in that the truncated GDS-II file is very incomplete with respect to the entire target IC layout, but is highly complete with respect to target circuit operation locations of the target IC. As such, a truncated GDS-II file may be communicated to vendors and provide accurate circuit operation information, but not provide much other information associated with the layout of the target IC.

Figure 13:
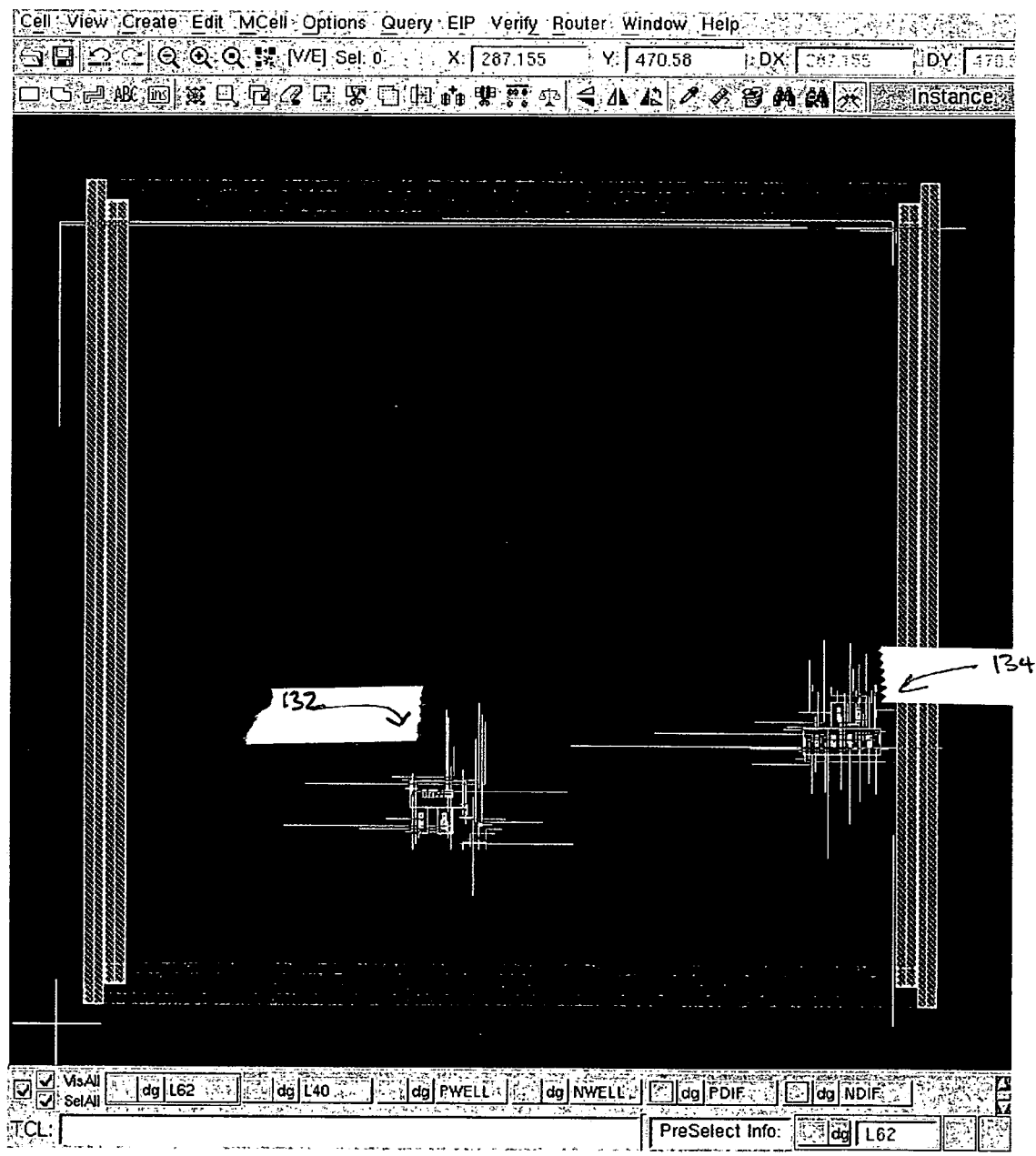
FIG. 13 is a screen shot of one possible truncated layout view corresponding with a circuit operation layout file, the layout view having layout information corresponding to one or more target circuit operation locations of the integrated circuit, and masking, hiding, or otherwise truncating other portions of the layout data, in accordance with aspects of the present invention.

FIG. 13 is a representative view of a layout view of truncated GDS-II data, in accordance with aspects of the present invention. The layout view shows two regions (132, 134) where layout data is visible. These two regions correspond to the X and Y coordinate information for two nets that will be joined in a joining operation. Layout information between and outside the two regions has been eliminated in the truncated GDS-II data, and is thus not visible in the layout view of the truncated GDS-II data.

Besides the circuit operation location information, which is provided in a truncated GDS-II file, all of the other circuit operation information is aggregated in an XML file which may be encrypted. Referring to FIGS. 1 and 2, the truncated GDS-II data 32 and the encrypted XML file 34 are transmitted to the back-end circuit editing platform for use by the charge particle tool operator to conduct a circuit operation (38, FIG. 1; operation 250, FIG. 2). The charge particle beam tool operator by way of the back-end circuit editing platform 72 has the opportunity to provide feedback or further define the circuit operation location definition or other circuit operation information (operation 260, FIG. 2), or perform the defined circuit operation (operation 270, FIG. 2). To further define the circuit operation, the back-end circuit editing platform has access to the same circuit operation definition tools 14, such as shown in FIGS. 3-7 and 12. As such, the back-end user may modify or enter any of the same information that is provided by the front-end user. Further, the back-end user may include comments explaining the additions or changes that have been made to the circuit operation definition (operation 280, FIG. 2). A circuit operation definition could be a back-and-forth discussion/collaboration between front-end design personnel and charge particle beam tool operators along with others. The present application provides a convenient and logical application for conducting the back and forth virtual discussion between front-end and back-end personnel. Further aspects of the present invention, such as the truncated GDS-II file and the encrypted XML file, provide efficient communication platforms to optimize the back-and-forth communication. Once the circuit operation definition is complete and agreed upon, then the operator performs the defined charged particle beam operation.

Figure 14:
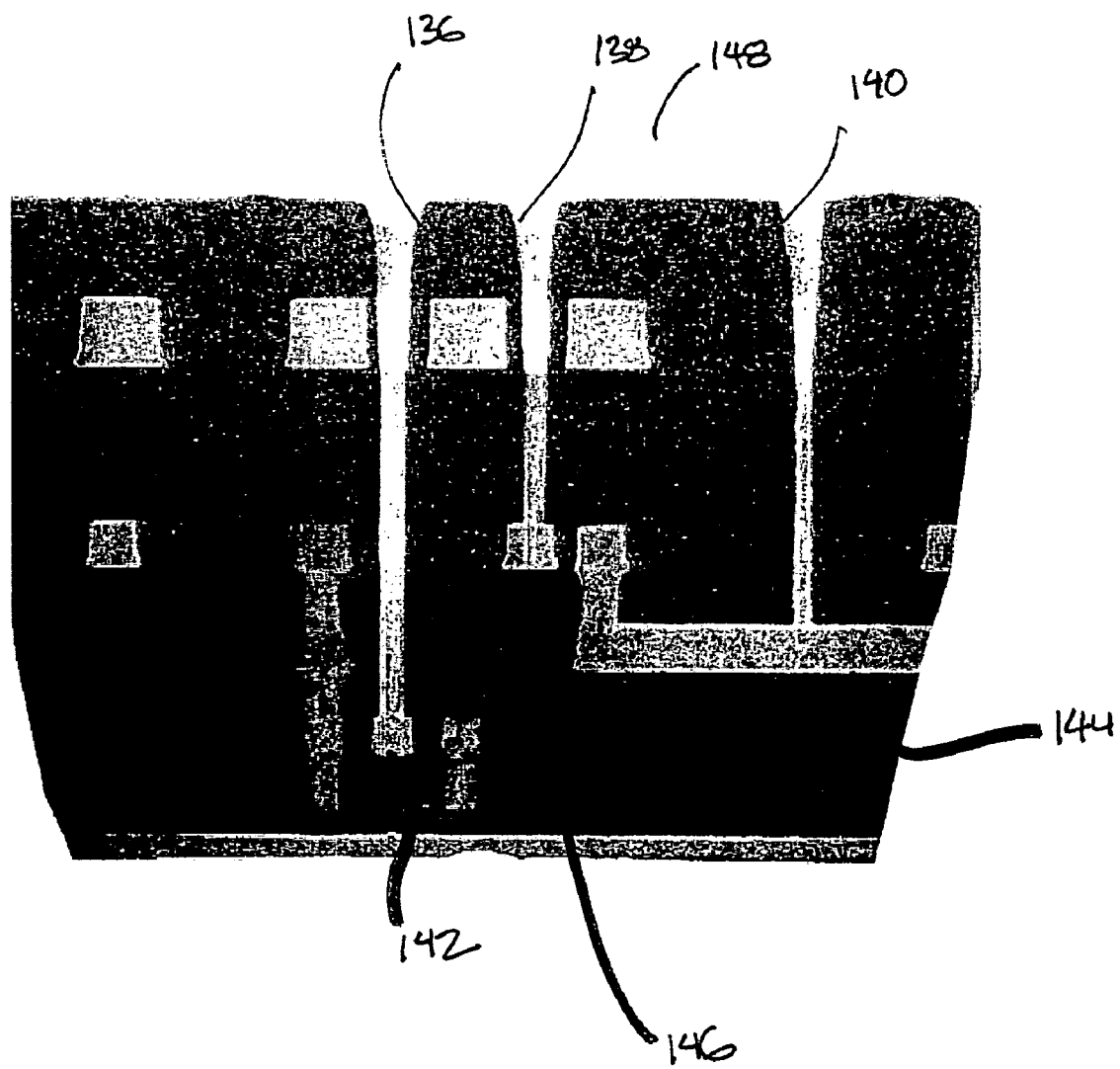
FIG. 14 is a screen shot of an image of a completed circuit operation performed on a fabricated integrated circuit, the image being part of a feedback loop related to the circuit operation definition and the circuit operation performed in accordance with a circuit operation definition provided in accordance with aspects of the present invention.

While conducting a circuit operation or at any point thereafter, the charged particle beam operator may save images at various zoom levels of the second operation performed. The reporting information, including the images, may be saved to a report file accessible to either the front-end or back-end user. FIG. 14 illustrates one example of an image of a circuit edit operation. The image shows three trenches (136, 138, 140) milled to different points in metal 1 142, metal 2 144, and metal 3 146 layers. The image further shows conductor 148 deposited in the trenches in order to form a conductive path between the target nets associated with the metal 1, metal 2, and metal 3 layers. In this way, the charged particle beam operator created a connection between three nets located at three metal layers.

Various aspects of the present invention, whether alone or in combination with other aspects of the invention, may be implemented in C++ code running on a computing platform operating in a LSB 2.0 Linux environment. However, aspects of the invention provided herein may be implemented in other programming languages adapted to operate in other operating system environments. Further, methodologies may be implemented in any type of computing platform, including but not limited to, personal computers, mini-computers, mainframes, workstations, networked or distributed computing environments, computer platforms separate, integral to, or in communication with charged particle tools, and the like. Further, aspects of the present invention may be implemented in machine readable code provided in any memory medium, whether removable or integral to the computing platform, such as a hard disc, optical read and/or write storage mediums, RAM, ROM, and the like. Moreover, machine readable code, or portions thereof, may be transmitted over a wired or wireless network.

Various examples of "screen shots" are provided to illustrate particular features and aspects of embodiments of the invention. These screen shots are meant to only illustrate platforms for communicating with a computer platform, circuit operation tool, and/or applications implemented to run on the computer platform and/or circuit operation tool, and are not meant to limit the invention to the particular screens or arrangements of screens described herein. Other computer communication mediums may be used, such as "hot keys," line entry, and the like, without departing from the invention subject matter defined in the claims.

Although various representative embodiments of this invention have been described above with a certain degree of particularity, those skilled in the art could make numerous alterations to the disclosed embodiments without departing from the spirit or scope of the inventive subject matter set forth in the specification and claims. In methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting.

We claim:

1. A method for defining circuit operations using a circuit operation tool comprising:

providing navigation of computer aided design data for an integrated circuit, the computer aided design data for the integrated circuit including integrated circuit layout data and integrated circuit logic data;

receiving a definition of a location for conducting one of a circuit edit or a probe point creation based on the computer aided design data for the integrated circuit; and generating at least one file containing information concerning the location for conducting one of the circuit edit or a probe point creation on the integrated circuit, wherein the providing navigation, receiving and generating are implemented in a front-end environment;

providing for communication of the at least one file from the front-end environment to the circuit operation tool at a back-end environment; and performing one of a circuit edit or a probe point creation utilizing the information contained in said at least one file with the circuit operation tool.

2. The method of claim 1 further comprising:
providing for alteration of the at least one file at the circuit operation tool; and
providing for communication of the alteration of the at least one file from the circuit operation tool to the front-end environment for further alteration.

3. The method of claim 1 wherein providing navigation of said computer aided design data comprises providing for highlighting of layout data corresponding to selected logic data.

4. The method of claim 1 wherein providing navigation of said computer aided design data comprises providing for selecting of layout data to identify a location for conducting a circuit operation on the integrated circuit.

5. The method of claim 1 further comprising providing access to at least one circuit operation optimization application.

6. The method of claim 5 wherein the at least one circuit operation optimization application generates at least one optimal location for a circuit operation.

7. The method of claim 1 wherein the generating at least one file comprises generating an encrypted XML file including configuration parameters.

8. The method of claim 7 wherein the configuration parameters comprise one or more of edit width, edit length, edit depth, edit time, beam current, gas type, and scan pattern.

9. The method of claim 1 wherein generating at least one file comprises generating a file containing layout data that is a subset of all layout data, the subset corresponding with the location for conducting the circuit operation.

10. The method of claim 1 wherein the circuit operation tool comprises a charged particle tool.

11. The method of claim 10 wherein the charged particle tool comprises a focused ion beam.

12. The method of claim 11 wherein the charged particle tool comprises an electron beam tool.

13. The method of claim 1 wherein generating at least one file comprises generating a file containing a plurality of alignment points corresponding with locations on the integrated circuit for alignment of the circuit operation tool.

14. The method of claim 1 further comprising generating a report concerning a circuit operation.

15. The method of claim 1 further comprising receiving a definition of configuration parameters, the configuration parameters selected from the group consisting of one or more of edit width, edit length, edit depth, edit time, beam current, gas type, and scan pattern, and wherein the at least one file generated further includes the defined configuration parameters.

16. A computing platform configured with computer executable instructions for performing operations comprising:

providing navigation of computer aided design data for an integrated circuit, the computer aided design data for the integrated circuit including integrated circuit layout data and integrated circuit logic data;

receiving a definition of a location for conducting one of a circuit edit or a probe point creation based on the computer aided design data for the integrated circuit;

generating at least one file containing information concerning the location for conducting one of the circuit edit or a probe point creation on the integrated circuit, wherein the providing navigation, receiving and generating are implemented in a front-end environment;

transmitting the at least one file from the front-end environment to the circuit operation tool at a back-end environment; and performing one of a circuit edit or a probe point creation utilizing the information contained in said at least one file with the circuit operation tool.

17. A method for performing a circuit operation comprising:

providing navigation of computer aided design data for an integrated circuit, the computer aided design data for the integrated circuit including integrated circuit layout data and integrated circuit logic data;

receiving a user definition of a location for conducting one of a circuit edit or a probe point creation based on the computer aided design data for the integrated circuit; and generating at least one file containing truncated computer aided design data concerning the location for conducting the one of the circuit edit or a probe point creation on the integrated circuit, a plurality of alignment points corresponding with locations on the integrated circuit for alignment of the circuit operation tool, and a subset of all layout data, the subset corresponding with the location for conducting the circuit operation.

18. The method of claim 17 wherein the truncated computer aided design data includes one or more truncated GDS-II data files.

19. The method of claim 17 further comprising performing one of a circuit edit or a probe point contact utilizing the truncated computer aided design data contained in said at least one file.

20. The method of claim 16 further comprising receiving a definition of configuration parameters, the configuration parameters selected from the group consisting of one or more of edit width, edit length, edit depth, edit time, beam current, gas type, and scan pattern, and wherein the at least one file generated further includes the defined configuration parameters.

* * * * *